(12) United States Patent
Tseng et al.

(10) Patent No.: US 12,476,228 B2
(45) Date of Patent: Nov. 18, 2025

(54) WAFER LEVEL PACKAGING PROCESS FOR THIN FILM INDUCTORS

(71) Applicant: QUALCOMM Incorporated, San Diego, CA (US)

(72) Inventors: Anshih Tseng, Fremont, CA (US); Peng Zou, Camas, WA (US)

(73) Assignee: QUALCOMM Incorporated, San Diego, CA (US)

( * ) Notice: Subject to any disclaimer, the term of this patent is extended or adjusted under 35 U.S.C. 154(b) by 408 days.

(21) Appl. No.: 18/172,975

(22) Filed: Feb. 22, 2023

(65) Prior Publication Data
US 2024/0072023 A1 Feb. 29, 2024

Related U.S. Application Data (60) Provisional application No. 63/400,971, filed on Aug. 25, 2022.

(51) Int. Cl.
*H01L 21/683* (2006.01)
*H01L 25/16* (2023.01)
(Continued)

(52) U.S. Cl.
CPC .......... *H01L 25/16* (2013.01); *H01L 21/6835* (2013.01); *H01L 25/18* (2013.01);
(Continued)

(58) Field of Classification Search
CPC ..... H01L 25/16; H01L 21/6835; H01L 25/18; H01L 24/16; H01L 2221/68381;
(Continued)

(56) References Cited

U.S. PATENT DOCUMENTS

| | | | |
|---|---|---|---|
| 7,531,407 B2 * | 5/2009 | Clevenger | H01L 23/481 |
| | | | 257/E21.022 |
| 7,727,806 B2 * | 6/2010 | Uhland | B81C 1/0023 |
| | | | 257/E21.511 |

(Continued)

FOREIGN PATENT DOCUMENTS

| | | |
|---|---|---|
| EP | 3886126 A1 | 9/2021 |
| WO | 2020106214 A1 | 5/2020 |

OTHER PUBLICATIONS

International Search Report and Written Opinion—PCT/US2023/070720—ISA/EPO—Oct. 13, 2023.

*Primary Examiner* — Vu A Vu
(74) *Attorney, Agent, or Firm* — Loza & Loza LLP (57) ABSTRACT

An aspect relates to a method of forming an integrated circuit (IC) package, including: forming a thin-film inductor (TFI) over a first dummy carrier wafer; attaching an integrated circuit (IC) die to and over the TFI; attaching a second dummy carrier wafer to and over the IC die; removing the first dummy carrier wafer from the TFI; attaching at least one solder bump to and under the TFI; and removing the second dummy carrier wafer from the IC die. Another aspect relates to a method of forming an IC package, including forming a first redistribution layer (RDL) over a through-silicon via (TSV); forming a second RDL under the TSV; forming a thin-film inductor (TFI) over the first RDL; and attaching at least one integrated circuit (IC) die to the second RDL or the TFI.

28 Claims, 9 Drawing Sheets

(51) Int. Cl.
*H01L 25/18* (2023.01)
*H10D 1/20* (2025.01)
*H01L 23/00* (2006.01)
(52) U.S. Cl.
CPC ............... *H10D 1/20* (2025.01); *H01L 24/16* (2013.01); *H01L 2221/68381* (2013.01); *H01L 2224/16227* (2013.01)
(58) Field of Classification Search
CPC ......... H01L 2224/16227; H01L 21/561; H01L 23/645; H01L 25/0655; H01L 25/50; H01L 2221/68331; H10D 1/20
USPC .......................................................... 257/731
See application file for complete search history.

(56) References Cited

U.S. PATENT DOCUMENTS

| | | | |
|---|---|---|---|
| 7,749,814 B2 * | 7/2010 | Lin ..................... | H01L 21/6836 |
| | | | 257/E21.294 |
| 9,337,086 B2 * | 5/2016 | Scanlan .................. | H01L 24/96 |
| 9,496,213 B2 * | 11/2016 | Kidwell, Jr. ...... | H01L 23/49822 |
| 9,754,909 B2 * | 9/2017 | Jiang ...................... | H01L 24/11 |
| 9,997,447 B1 * | 6/2018 | Chen .................. | H01F 17/0006 |
| 10,002,828 B2 * | 6/2018 | Sturcken ............... | H01L 21/321 |
| 10,290,414 B2 * | 5/2019 | Yun .......................... | H01F 41/32 |
| 10,818,608 B2 * | 10/2020 | Liu ....................... | H01L 23/552 |
| 10,842,021 B1 * | 11/2020 | Song ....................... | H01F 27/24 |
| 10,923,417 B2 * | 2/2021 | Liao ...................... | H01L 23/645 |
| 11,348,884 B1 * | 5/2022 | Chiang .................... | H01L 25/16 |
| 2010/0244188 A1 | 9/2010 | Mihara | |
| 2011/0024916 A1 | 2/2011 | Marimuthu et al. | |
| 2012/0175732 A1 | 7/2012 | Lin et al. | |
| 2017/0062120 A1 | 3/2017 | Yun et al. | |
| 2018/0182726 A1 | 6/2018 | Wagner | |
| 2019/0385980 A1 | 12/2019 | Chen et al. | |
| 2020/0027861 A1 | 1/2020 | Zhai | |
| 2020/0211958 A1 | 7/2020 | Liu et al. | |
| 2021/0134525 A1 * | 5/2021 | Wang ..................... | H01F 27/327 |
| 2021/0375775 A1 | 12/2021 | Lin et al. | |
| 2023/0056755 A1 * | 2/2023 | Cheng ..................... | H01Q 1/38 |

\* cited by examiner

WAFER LEVEL PACKAGING PROCESS FOR THIN FILM INDUCTORS

CROSS REFERENCE TO RELATED APPLICATION

This application claims the benefit of the filing date of Provisional Application Ser. No. 63/400,971, filed on Aug. 25, 2022, which is incorporated herein by reference.

FIELD

Aspects of the present disclosure relate generally to integrated circuit (IC) packaging, and in particular, to wafer level packaging (WLP) processes for integrating integrated circuits (ICs) with thin film inductors (TFI).

BACKGROUND

An integrated circuit (IC) may be electrically coupled to one or more inductors by way of metallization traces on a printed circuit board (PCB) upon which the IC and the one or more inductors are mounted. In such arrangement, the one or more inductors may occupy significant PCB footprint, which generally drives up the cost of products incorporating such PCB with the IC and one or more inductors thereon. Moreover, there may be significant electrical path lengths between the IC and the one or more inductors, which may have adverse effects on circuit performance.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a method of forming an integrated circuit (IC) package. The method includes forming a thin-film inductor (TFI) over a first dummy carrier wafer; attaching an integrated circuit (IC) die to and over the TFI; attaching a second dummy carrier wafer to and over the IC die; removing the first dummy carrier wafer from the TFI; attaching at least one solder bump to and under the TFI; and removing the second dummy carrier wafer from the IC die.

Another aspect of the disclosure relates to an integrated circuit (IC) package. The IC package includes: at least one thin-film inductor (TFI); a set of integrated circuit (IC) dies coupled to the at least one TFI; and a set of solder bumps coupled to the at least one TFI.

Another aspect of the disclosure relates to a method of forming an integrated circuit (IC) package. The method includes forming a first redistribution layer (RDL) over a through-silicon via (TSV); forming a second RDL under the TSV; forming a thin-film inductor (TFI) over the first RDL; and attaching at least one integrated circuit (IC) die to the second RDL or the TFI.

Another aspect of the disclosure relates to an integrated circuit (IC) package. The IC package includes: a thin-film inductor (TFI); an integrated circuit (IC) die coupled to a first terminal of the TFI; a solder bump coupled to a second terminal of the TFI; and a through-silicon via (TSV) by way of which the IC die or the solder bump is coupled to the first terminal or the second terminal of the TFI, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
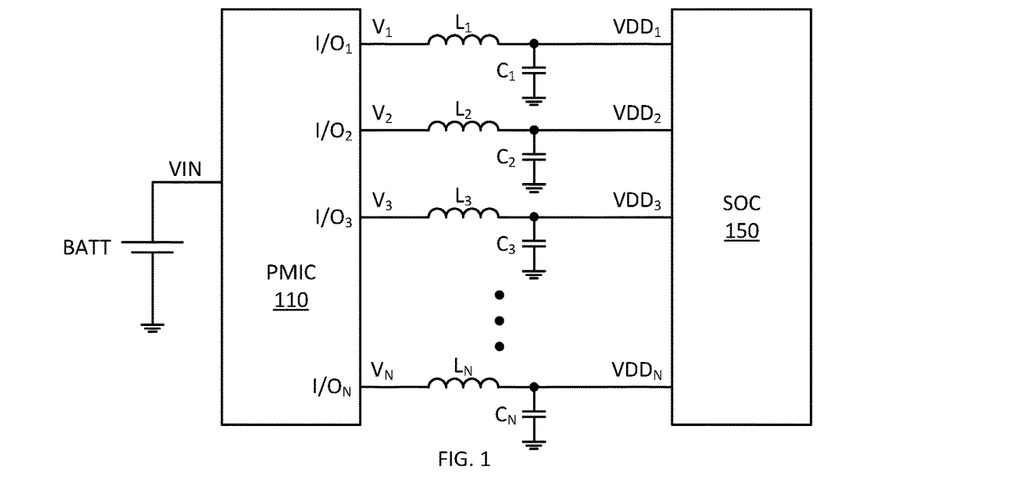
FIG. 1 illustrates a block diagram of an example power supplying circuit in accordance with an aspect of the disclosure.

FIG. 1 illustrates a block diagram of an example power supplying circuit 100 in accordance with an aspect of the disclosure. The power supplying circuit 100 includes a power management integrated circuit (PMIC) 110 including an input coupled to a battery (or other voltage source) to receive an input voltage VIN. The PMIC 110 may be configured to generate a set of voltages $V_1$ to $V_N$ at a set of input/output (I/O) ports $I/O_1$ to $I/O_N$ based on the input voltage VIN, respectively.

The power supplying circuit 100 includes a set of inductors $L_1$ to $L_N$ coupled in series between the set of input/output ports $I/O_1$ to $I/O_N$ and a set of power (supply voltage) rail inputs $VDD_1$ to $V_{DDN}$ of an integrated circuit (IC) 150, such as a system on chip (SOC). The power supplying circuit 100 includes a set of shunt capacitors $C_1$ to $C_N$ coupled between the power rail inputs $VDD_1$ to $V_{DDN}$ of the SOC 150 and a lower voltage rail (e.g., ground).

The SOC 150 includes functional circuits coupled to the set of power rail inputs $VDD_1$ to $V_{DDN}$. The functional circuits are configured to draw dynamic currents from the PMIC 110 via the set of power rail inputs $VDD_1$ to $V_{DDN}$, respectively. The dynamic currents may vary relatively fast and significantly. Accordingly, if not stabilized, the set of power rail voltages $V_{DD1}$ to $V_{DDN}$ would vary significantly, adding noise and potentially causing functional problems in and/or damage to the SOC 150. Thus, the set of inductors/capacitors $L_1/C_1$ to $L_N/C_N$ assists in maintaining the power rail voltages $V_{DD1}$ to $V_{DDN}$ substantially stable notwithstanding the dynamic current demands from the SOC 150.

Figure 2:
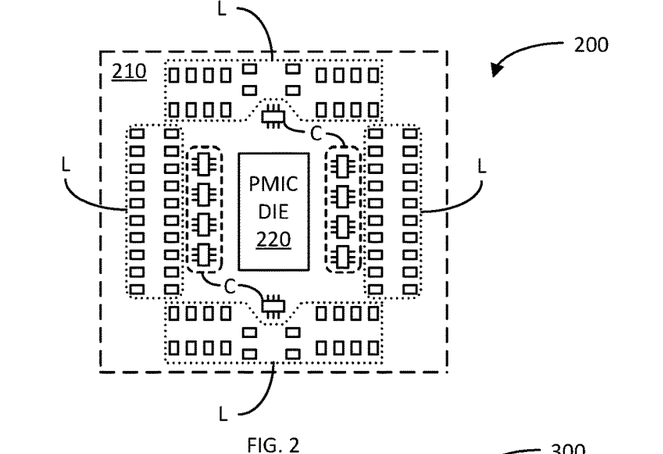
FIG. 2 illustrates a top view of another example power supplying circuit in accordance with another aspect of the disclosure.

FIG. 2 illustrates a top view of another example power supplying circuit 200 in accordance with another aspect of the disclosure. The power supplying circuit 200 may be an example of a physical implementation of at least a portion of the power supplying circuit 100 previously discussed. The power supplying circuit 200 includes a PMIC die 220 mounted on a printed circuit board (PCB) 210. The PMIC die 220 may correspond to the PMIC 110 of power supplying circuit 100.

The power supplying circuit 200 also includes a set of inductors L (delineated by a dotted-line surrounding the inductors L) and a set of capacitors C (delineated by a short dashed-line surrounding the capacitors C). The sets of inductors L and capacitors C are mounted on the PCB 210 near and generally surrounding the PMIC die 220. The sets of inductors L and capacitors C may correspond to the sets of series inductors $L_1$ to $L_N$ and shunt capacitors $C_1$ to $C_N$ of power supplying circuit 100, respectively.

A drawback of the power supplying circuit 200 is that the sets of inductors L and capacitors C occupy significant footprint of the PCB 210, which generally increases the costs of the power supplying circuit 200 and/or restricts the number of components that can be mounted on the PCB 210. Another drawback of the power supplying circuit 200 is that there are considerable electrical path lengths between the PMIC die 220 and the sets of inductors L and capacitors C, which generally has adverse effects on the stabilization, noise, and other performance characteristics associated with the set of supply voltages $VDD_1$ to VDD N provided to the SOC 150.

Figure 3:
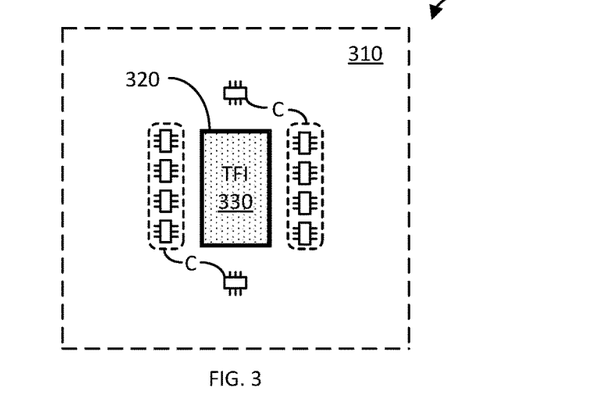
FIG. 3 illustrates a top view of another example power supplying circuit in accordance with another aspect of the disclosure.

FIG. 3 illustrates a top view of another example power supplying circuit 300 in accordance with another aspect of the disclosure. The power supplying circuit 300 may be an example of a physical implementation of at least a portion of the power supplying circuit 100 previously discussed. The power supplying circuit 300 includes a PMIC die 320 mounted on a printed circuit board (PCB) 310. The PMIC die 320 may correspond to the PMIC 110 of power supplying circuit 100.

The power supplying circuit 300 also includes a set of capacitors C (delineated by a short dashed-line surrounding the capacitors C). The power supplying circuit 300 includes an array or set of thin-film inductors (TFIs) 330 formed on top of the PMIC die 320. The set of TFIs 330 and the set of capacitors C may correspond to the sets of series inductors $L_1$ to $L_N$ and shunt capacitors $C_1$ to $C_N$ of power supplying circuit 100, respectively.

An advantage of the power supplying circuit 300 over the power supplying circuit 200 is that the set of TFIs 330 are formed on the PMIC die 320; and thereby, does not occupy any additional PCB footprint. Thus, the costs of the power supplying circuit 300 may be reduced compared to the power supplying circuit 200. Additionally, as the set of TFIs 330 are situated on top of the PMIC die 320, the electrical path lengths between the I/O ports of the PMIC die 320 and the set of TFIs 330 are substantially shorter compared to that of the power supplying circuit 200. Thus, the stabilization, noise, and other performance characteristics associated with the set of supply voltages $VDD_1$ to $V_{DDN}$ provided to the SOC 150 may be significantly improved.

Figure 4A:
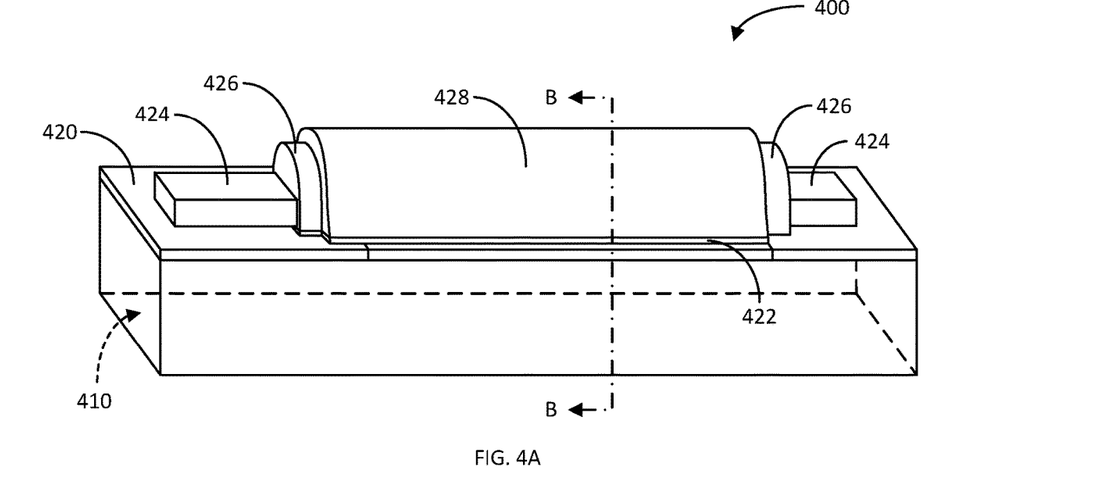
FIG. 4A illustrates a side perspective view of an example thin-film inductor (TFI) in accordance with another aspect of the disclosure.

FIG. 4A illustrates a side perspective view of an example thin-film inductor (TFI) 400 in accordance with another aspect of the disclosure. The TFI 400 may be an example of one of the set of TFIs 330. As previously mentioned, the TFI 400 may be formed on an integrated circuit (IC) die 410, such as a power management integrated circuit (PMIC) die or other type of IC die (e.g., a memory).

In particular, the TFI 400 includes a first electrical insulating layer 420 (e.g., a silicon dioxide ($SiO_2$), silicon nitride ($Si_3N_4$), polymer (e.g., polyimide, polybenzoxazoles (PBO), or other), etc.) formed over the IC die 410. It shall be understood that the term "over" is with regard to a particular orientation of the TFI 400 or any other TFI or IC package described herein; and that the orientation of such items is not critical to the concepts described herein. Thus, in one orientation, it may be described that a first material is over a second material, and in another orientation (e.g., up-side-down), the first material is under the second material—both describe the same item.

The TFI 400 further includes a first magnetic layer (MAG1) 422 disposed over the first electrical insulating layer 420. Examples of such magnetic material include cobalt-zirconium-tantalum (CZT), cobalt-zirconium-tantalum-boron (CZTB), or other. The TFI 400 further includes a first metal (e.g., copper (Cu)) redistribution layer (RDL) 424 formed over the first magnetic layer (MAG1) 422 and the first electrical insulating layer 420. Although not shown in FIG. 4A, a thin electrical insulating layer may electrically isolate the first RDL 424 from the first magnetic layer (MAG1) 422.

Additionally, the TFI 400 includes an electrical insulating dome (e.g., polymer (e.g., polyimide, PBO, or other)) 426 formed over a portion of the first RDL 424 that lies over the first magnetic layer (MAG1) 422. Further, the TFI 400 includes a second magnetic layer (MAG2) 428 formed over the electrical insulating dome 426. Thus, the electrical insulating dome 426 electrically isolates the second (or upper) magnetic layer (MAG2) 428 from the first (lower) magnetic layer (MAG1) 422 and the RDL 424. A first portion of the RDL 424 extends beyond the dome 426 in a first direction (to the left of the dome as shown in FIG. 4A) and a second portion of the RDL 424 extends beyond the dome 426 in a second direction, opposite to the first direction (to the right of the dome as shown in FIG. 4A).

Figure 4B:
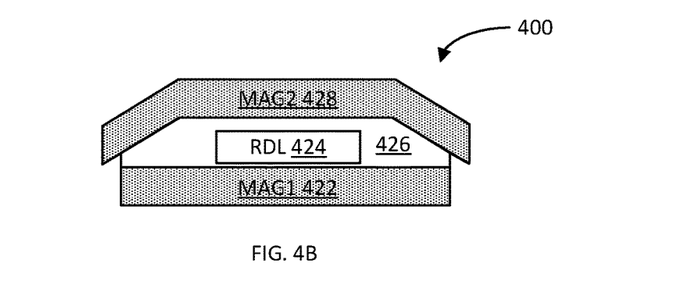
FIG. 4B illustrates a cross-sectional view of the example thin-film inductor (TFI) of FIG. 4A in accordance with another aspect of the disclosure.

FIG. 4B illustrates a cross-sectional view of a portion of the example thin-film inductor (TFI) 400 along line B-B in accordance with another aspect of the disclosure. As illustrated, the first (lower) magnetic layer (MAG1) 422, electrical insulating dome 426, and second (upper) magnetic layer (MAG2) 428 form a tunnel through which the Cu RDL 424 extends. One side of the Cu RDL 424 (e.g., a left side of the tunnel as shown in FIG. 4A) forms at least a portion of a first terminal of the TFI 400, and the other or opposite side of the Cu RDL 424 (e.g., a right side of the tunnel as shown in FIG. 4A) forms at least another portion of a second terminal of the TFI 400.

Figure 4C:
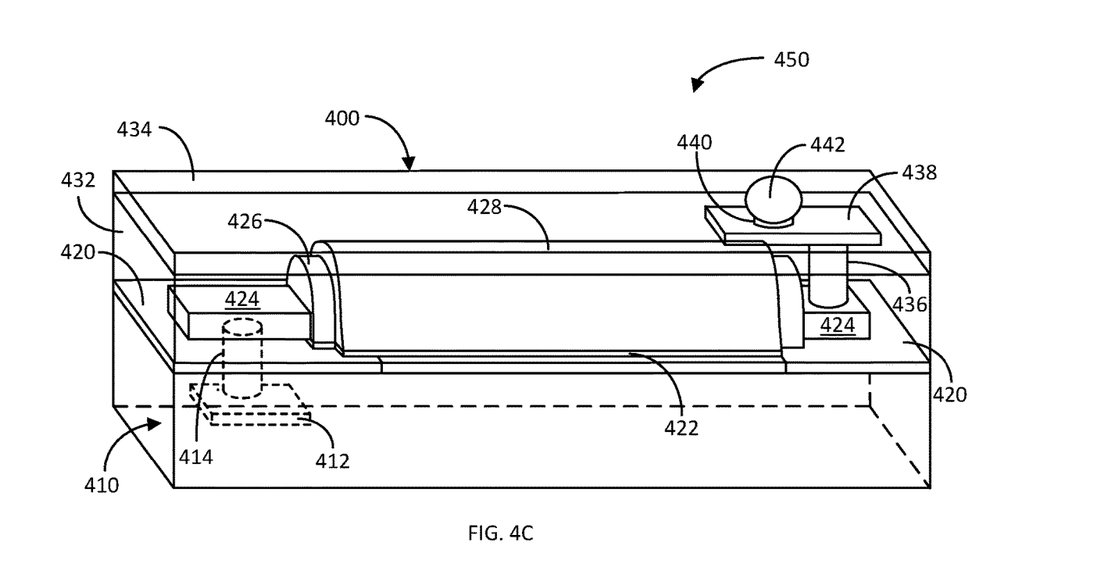
FIG. 4C illustrates a side perspective view of an example integrated circuit (IC) package in accordance with another aspect of the disclosure.

FIG. 4C illustrates a side perspective view of an example an integrated circuit (IC) package 450 in accordance with another aspect of the disclosure. The IC package 450 includes the PMIC die 410, and the TFI 400 formed over the PMIC die 410. The electrical connection between the PMIC die 410 and the TFI 400 includes a top most metallization layer 412 (also referred to as the aluminum (AP) layer), and a first metallized via (VIA1) 414 through the electrical insulating layer 420, formed over and electrically coupled to the AP layer 412. The first (left as shown in FIG. 4C) end of the Cu RDL 424 is formed over and electrically coupled to the first metallized via (VIA1) 414.

The TFI 400 further includes first passivation layer (PA1) 432 (e.g., polymer (e.g., polyimide, PBO, or other), epoxy mold compound, or other) formed over the electrical insulating layer 420, Cu RDL 424, dome 426, and second magnetic layer (MAG2) 428. Additionally, the TFI 400 includes a second passivation layer (PA2) 434 (e.g., polymer (e.g., polyimide, PBO, or other), epoxy mold compound, or other) formed over the first passivation layer (PA1) 432. The TFI 400 further includes a second metallized via (VIA2) 436 formed through the first and second passivation layers (PA1) 432 and (PA2) 434, and over and electrically coupled to the second (right as shown in FIG. 4C) end of the Cu RDL 424. Also, the TFI 400 includes a second metal (Cu) RDL 438 formed over the second passivation layer (PA2) 434, and over and electrically coupled to the second metallized via (VIA2) 436. Further, the TFI 400 includes an under bump metal (UBM) 440 formed over the second Cu RDL 438, and a solder bump (e.g., solder ball) 442 formed over the UBM 440. The solder bump 442 may be coupled to a shunt capacitor and SOC, as in power supplying circuit 100.

Figure 5A:
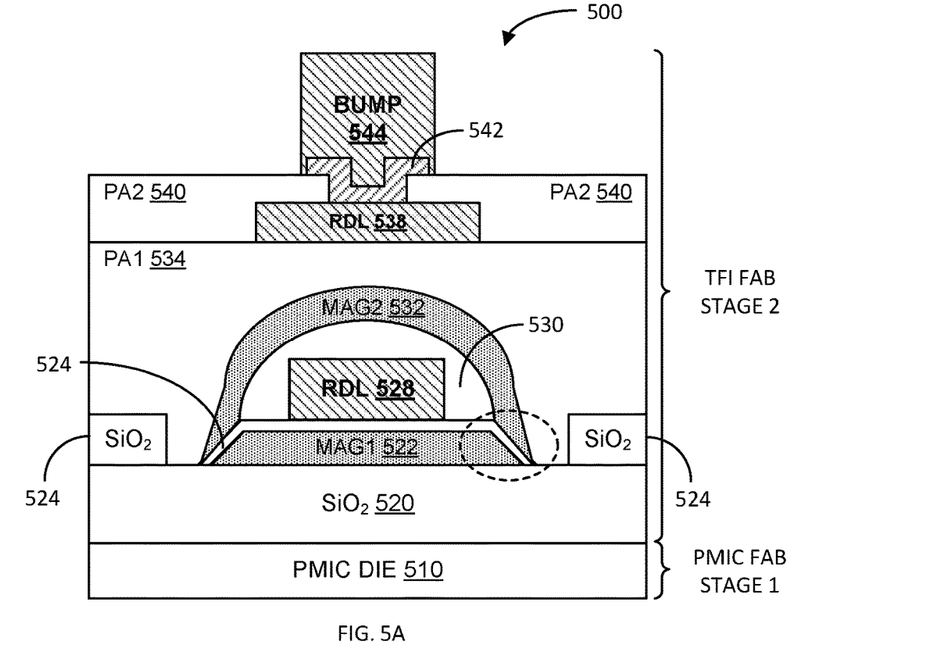
FIGS. 5A-5B illustrate orthogonal cross-sectional views of an example integrated circuit (IC) package including a power management integrated circuit (PMIC) die and a thin-film inductor (TFI) disposed over the PMIC die in accordance with another aspect of the disclosure.
Figure 5B:
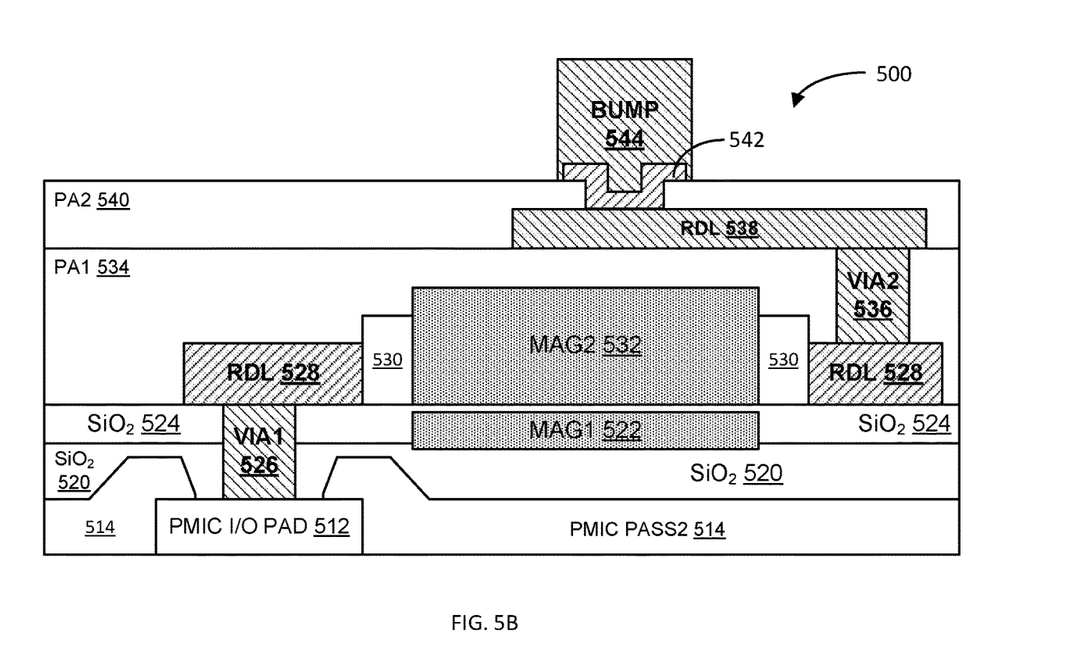

FIGS. 5A-5B illustrate orthogonal cross-sectional views of an example integrated circuit (IC) package 500 in accordance with another aspect of the disclosure. The fabrication of the IC package 500 typically entails first fabricating a power management integrated circuit (PMIC) die 510. The fabrication time for fabricating the PMIC die 510 may be around eight (8) weeks. Then, after the PMIC die 510 is fabricated, a thin-film inductor (TFI) is fabricated above the PMIC die 510. The fabrication time for the TFI above the PMIC die 510 may take another six (6) to seven (7) weeks. Thus, the lead time for the IC package 500 may be around 15 weeks. The fabrication of the TFI on top of the PMIC die 510 may be as follows:

According to the fabrication method, a first electrical insulating layer (e.g., $SiO_2$, $Si_3N_4$, polymer (e.g., polyimide, PBO, or other), etc.) 520 is formed over the PMIC die 510 including a PMIC I/O pad 512 (also known as the aluminum (AP) layer of the PMIC die 510) and a top passivation layer 514. Then, a first magnetic layer (MAG1) 522 (e.g., CZT, CZTB, or other) is formed over the first electrical insulating layer (e.g., $SiO_2$, $Si_3N_4$, polymer (e.g., polyimide, PBO, or other), etc.) 520. Then, a second electrical insulating layer (e.g., $SiO_2$, $Si_3N_4$, polymer (e.g., polyimide, PBO, or other), etc.) 524 is formed over the first electrical insulating layer 520 and the first magnetic layer (MAG1) 522. Then, a first metallized via (Via 1) 526 is formed through the first and second electrical insulating layers 520 and 524 down to the PMIC I/O pad 512. Thus, there are multiple dielectric materials 520 and 524 surrounding the metallized via (Via 1) 526.

Then, according to the TFI fabrication method, a first metal (e.g., Cu) redistribution layer (RDL) 528 is formed over the second electrical insulating layer 524 and the first metallized via (Via 1) 526. In this configuration, the first RDL 528 is electrically coupled to the PMIC I/O pad 512 by way of the metallized via (Via 1) 526. Then, an electrical insulating dome 530 (e.g., a polymer (e.g., polyimide, PBO, or other)) is formed over the first RDL 528 and the second electrical insulating layer 524. Then, a second magnetic layer (e.g., CZT, CZTB, or other) 532 is formed over the electrical insulating dome 530. Note, as shown within a dashed circle, and with regard to an interface of the first magnetic layer (MAG1) 522, the second electrical insulating layer 524, and the second magnetic layer (MAG2) 532 at the side tail edge of these layers as seen looking into the tunnel or longitudinal axis perspective of the TFI, at the interface, the layers 522, 524, and 532 slope substantially smoothly in parallel. As previously discussed, the TFI includes the first magnetic layer (MAG1) 522, the second electrical insulating layer 524, the first RDL 528, the electrical insulating dome 530, and the second magnetic layer 532.

To electrically couple the TFI to components external to the IC package 500, the TFI further includes forming a first passivation layer (PA1) 534 (e.g., electrical insulator, such as a polymer (e.g., polyimide, PBO, or other), epoxy mold compound, or other) formed over the second electrical insulating layer 524, the first RDL 528, the electrical insulating dome 530, and the second magnetic layer (MAG2) 532. Then, a second metallized via (Via 2) 536 is formed through the first passivation layer (PA1) 534 down to the first RDL 528. In this configuration, the portion of the first RDL 528 that extends to the left (as shown in FIG. 5B) of the dome 530 (where the first metallized via (Via 1) makes contact) may be considered the first terminal of the TFI, and the portion of the first RDL 528 that extends to the right (as shown in FIG. 5B) of the dome 530 (where the second metallized via (Via 2) makes contact) may be considered the second terminal of the TFI.

Further, according to the fabrication method, a second metal (e.g., Cu) RDL 538 is formed over the first passivation layer (PA1) 534, and over and electrically coupled to the second metallized via (Via 2) 536. Then, a second passivation layer (PA2) 540 (e.g., electrical insulator, such as a polymer (e.g., polyimide, PBO, or other), epoxy mold compound, or other) is formed over the first passivation layer (PA1) 534 and the second RDL 538. Then, an under bump metal (UBM) 542 is formed through the second passivation layer (PA2) 540 down to the second RDL 538. Then, a solder bump 544 is formed over the UBM 542 to complete the PMIC-TFI IC package 500. Again, because the fabrication of the PMIC die 510 and the TFI above the PMIC dies 510 is in series, the fabrication time for the IC package 500 may take about 14-15 weeks, which may be undesirably too long.

FIGS. 6A-6G illustrate cross-sectional views of an example integrated circuit (IC) package 600-1 to 600-6A or 600-6B at various stages of a fabrication method in accordance with another aspect of the disclosure. The fabrication method may be based on a three-dimensional (3D) fan-out wafer level processing (FOWLP). At least a portion of the fabrication method may be performed at the same time as the fabrication method of the PMIC die (and/or other IC die) in order to reduce the lead time to produce the IC package 600-6A or 600-6B.

Figure 6A:
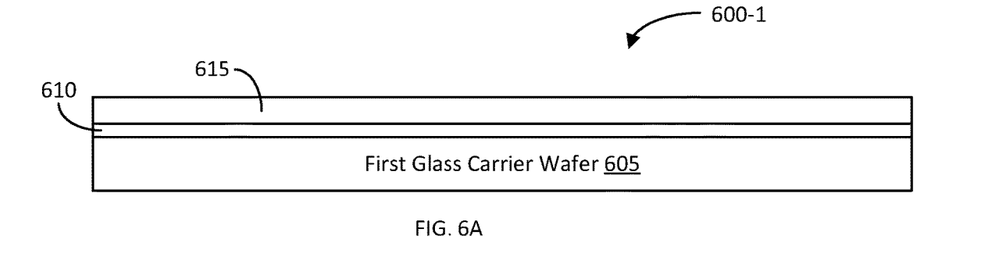
FIGS. 6A-6G illustrate cross-sectional views of an example integrated circuit (IC) package at various stages of an example fabrication method in accordance with another aspect of the disclosure.

With initial reference to FIG. 6A, according to the 3D FOWLP method, the IC package 600-1 may include, at an early stage, a first dummy carrier wafer 605 (e.g., transparent material, such as glass), a bonding (glue) layer 610 disposed (e.g., spin-coated) over the first dummy carrier wafer 605, and an electrical insulating layer (e.g., $SiO_2$, $Si_3N_4$, polymer, etc.) 615 disposed over the bonding layer 610. A thin-film inductor (TFI) (or an array or set thereof), such as the one described with reference to FIGS. 4A-4C and 5A-5B may be formed above (e.g., on top of) the electrical insulating layer 615. Accordingly, the electrical insulating layer 615 may correspond to the electrical insulating layers 520 and/or 524 of PMIC-TFI IC package 500 previously discussed.

Figure 6B:
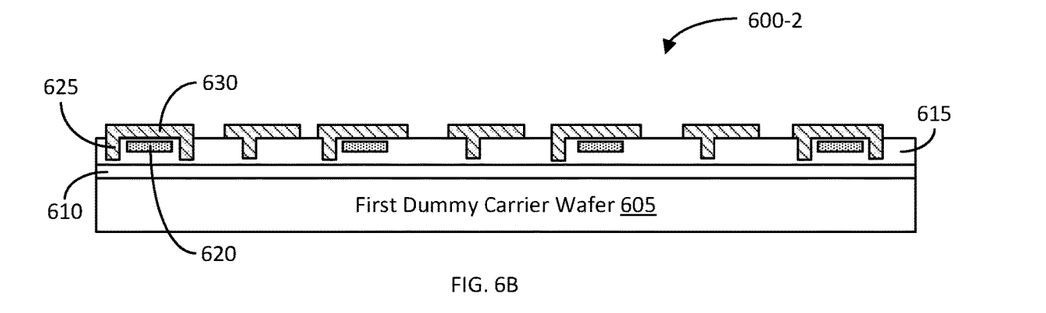

With reference next to FIG. 6B, according to the 3D FOWLP method, the IC package 600-2, and in particular, the electrical insulating layer 615, may undergo a deep reactive ion etching (DRIE) process to form a channel to accommodate a first magnetic layer 620. Then, the first magnetic layer 620 (e.g., CZT, CZTB, or other) is deposited and patterned over the channel within the first electrical insulating layer 615. Then, a first metallized via (Via 1) 625 and a first metal (e.g., Cu) redistribution layer (RDL) 630 are formed (e.g., by plating). The first metal RDL 630 is formed over of the first magnetic layer 620. With reference to PMIC-TFI IC package 500, the first magnetic layer 620 may correspond to the first magnetic layer 522, the first metallized via (Via 1) 625 may correspond to the first metallized via (Via 1) 526, and the first RDL 630 may correspond to the first RDL 528.

Figure 6C:
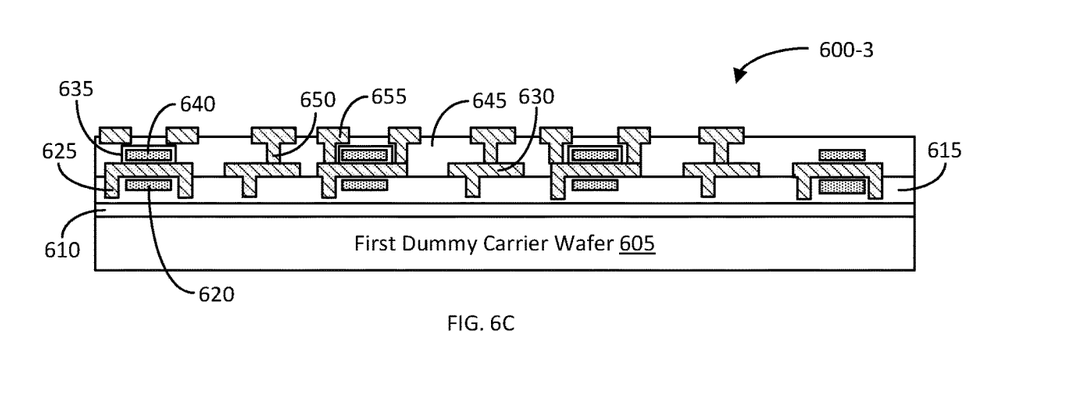

With reference next to FIG. 6C, according to the 3D FOWLP method, the IC package 600-3 may further include an electrical insulating dome 635 (e.g., a polymer (e.g., polyimide, PBO, or other)) formed over the first RDL 630, a second magnetic layer 640 (e.g., CZT, CZTB, or other) formed over the electrical insulating dome 635, a first passivation layer (e.g., $SiO_2$, $Si_3N_4$, polymer (e.g., polyimide, PBO, or other), etc.) 645 formed over the second magnetic layer 640 (including portions of layers 615, 630, and 635), a second metallized via (Via 2) 650 is formed through the first passivation layer 645 down to the first RDL 630, and a second metal (e.g., Cu) redistribution layer (RDL) 655 is formed over the second metallized via (Via 2) 650.

For example, the redistribution layer (RDL) 655 may be pasted with alloy solder ready for die attach later. With reference to PMIC-TFI IC package 500, the electrical insulating dome 635 may correspond to the electrical insulating dome 530, the second magnetic layer 640 may correspond to the second magnetic layer 532, the first passivation layer 645 may correspond to the first passivation layer 534, the second metallized via 650 may correspond to the second metallized via 536, and the second RDL 655 may correspond to the second RDL 538.

Figure 6D:
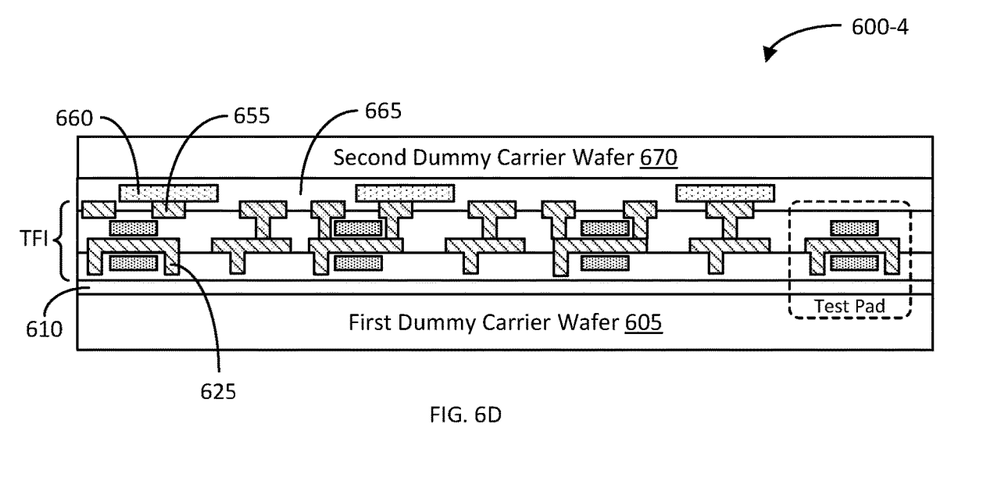

With reference next to FIG. 6D, according to the 3D FOWLP method, the IC package 600-4 further includes at least one PMIC die 660 including an I/O pad (e.g., aluminum or AP layer) attached to the second RDL 655 of the corresponding TFI. It shall be understood that the TFI could be flipped. In other words, the second RDL 655 may make contact with the solder bumps 675 (See FIG. 6E), whereas the metallized via (VIA1) 625 of the TFI may make contact to the at least one PMIC die 660. A bonding (glue) layer 665 is formed (spin-coated) over the PMIC die 660 and the TFI to effectuate an attachment of the TFI to a second dummy carrier wafer 670 (e.g., transparent material, such as glass) disposed over the bonding layer 665.

Figure 6E:
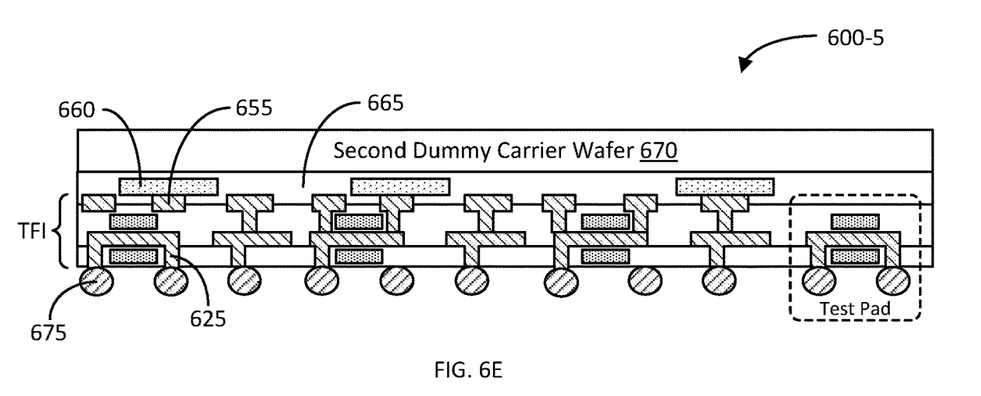

With reference to FIG. 6E, according to the 3D FOWLP method, the IC package 600-5 has the first bonding layer 610 and first dummy carrier wafer 605 removed (e.g., debonded) by subjecting the first bonding layer 610 with a laser power via the first glass (transparent) dummy carrier wafer 605. Then, at least one solder bump (e.g., solder ball) 675 is attached to the first metallized via (Via 1) 625 of the TFI. Note, that in contrast to IC package 500, the PMIC die 660 is attached from "above" (e.g., to the upper RDL 655); whereas, the PMIC die 510 is attached from below (e.g., to the first metallized via (Via 1) 526).

Figure 6F:
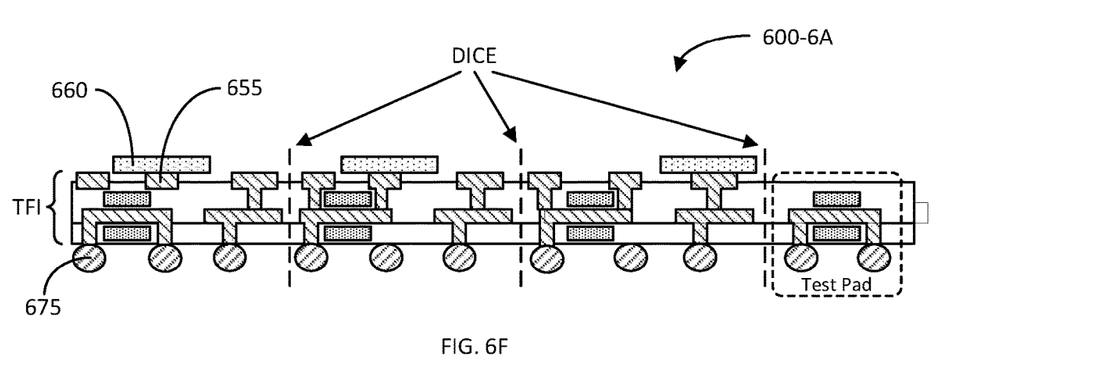
Figure 6G:
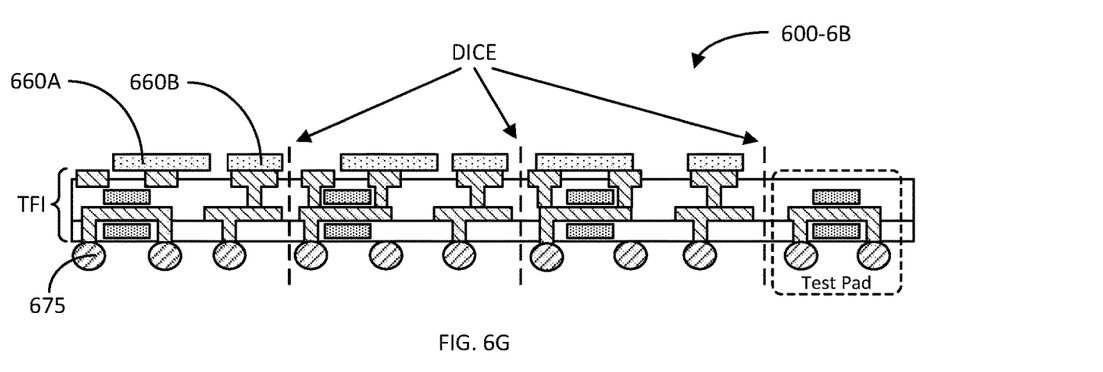

With reference next to FIG. 6F, according to the 3D FOWLP method, the IC package 600-6A has the second bonding layer 665 and the second dummy carrier wafer 670 removed (e.g., debonded) by subjecting the second bonding layer 665 with a laser power via the second glass (transparent) dummy carrier wafer 670. Then, the IC packaged 600-6A is diced to separate distinct PMIC-TFI IC packages.

In an alternative implementation, the IC package 600-6B may include two or more different types of IC dies 660A and 660B (e.g., PMIC and memory dies) attached to the TFI during the attachment fabrication stage depicted in FIG. 6D. Accordingly, with reference next to FIG. 6G, according to the 3D FOWLP method, the IC package 600-6B has the second bonding layer 665 and the second dummy carrier wafer 670 removed (debonded) by subjecting the second bonding layer 665 with a laser via the second glass (transparent) dummy carrier wafer 670. Then, the IC package 600-6B is diced to produce separate IC die packages.

FIGS. 7A-7E illustrate cross-sectional views of another example integrated circuit (IC) package 700-1 to 700-4A or 700-4B at various stages of another example fabrication method in accordance with another aspect of the disclosure. The fabrication method may be based on a 2.5D fan-out wafer level processing (FOWLP). At least a portion of the fabrication method may be performed at the same time as the fabrication method of the PMIC die (and/or other IC die) in order to reduce the lead time to produce the IC package 700-4A or 700-7B.

Figure 7A:
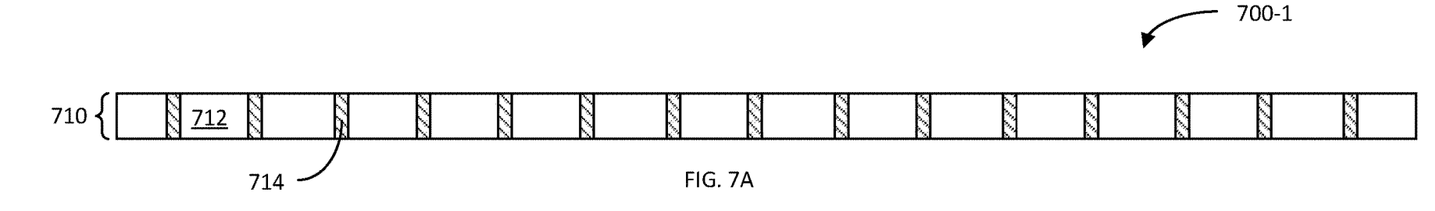
FIGS. 7A-7E illustrate cross-sectional views of another example integrated circuit (IC) package at various stages of another example fabrication method in accordance with another aspect of the disclosure.
Figure 7B:
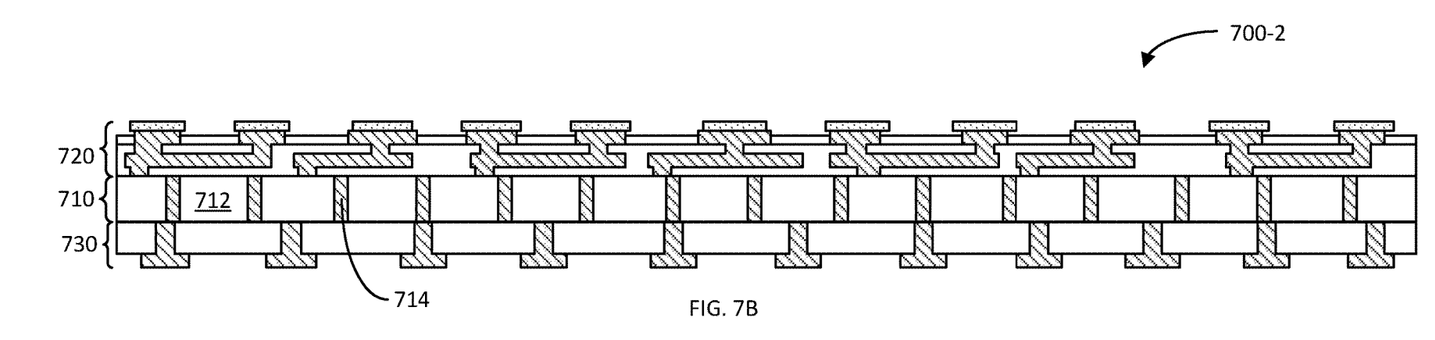

With initial reference to FIG. 7A, according to the 2.5D FOWLP method, the IC package 700-1 may include, at an early stage, a through-silicon via (TSV) 710 including a set of metallized vias 714 formed through a silicon wafer 712. With reference next to FIG. 7B, according to the 2.5D FOWLP method, the IC package 700-2 includes an upper redistribution layer (RDL) 720 formed over an upper side of the TSV 710, and a lower redistribution layer (RDL) 730 formed under a lower side of the TSV 710.

Figure 7C:
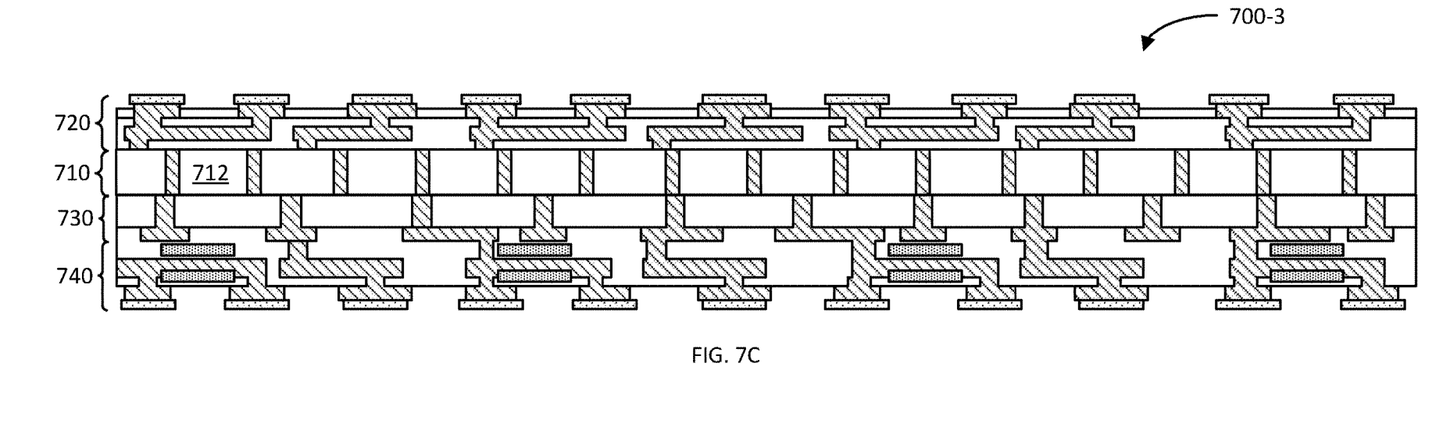

With further reference to FIG. 7C, according to the 2.5D FOWLP method, a thin-film inductor (TFI) (or an array or set thereof), may be formed over the upper RDL 720 or under the lower RDL 730. In the example in FIG. 7C, the IC package 700-3 includes a TFI 740 formed under and attached to the lower RDL 730. The TFI 740 may be formed by any of the processes previously discussed, such as those discussed with reference to IC packages 500 and 600.

Figure 7D:
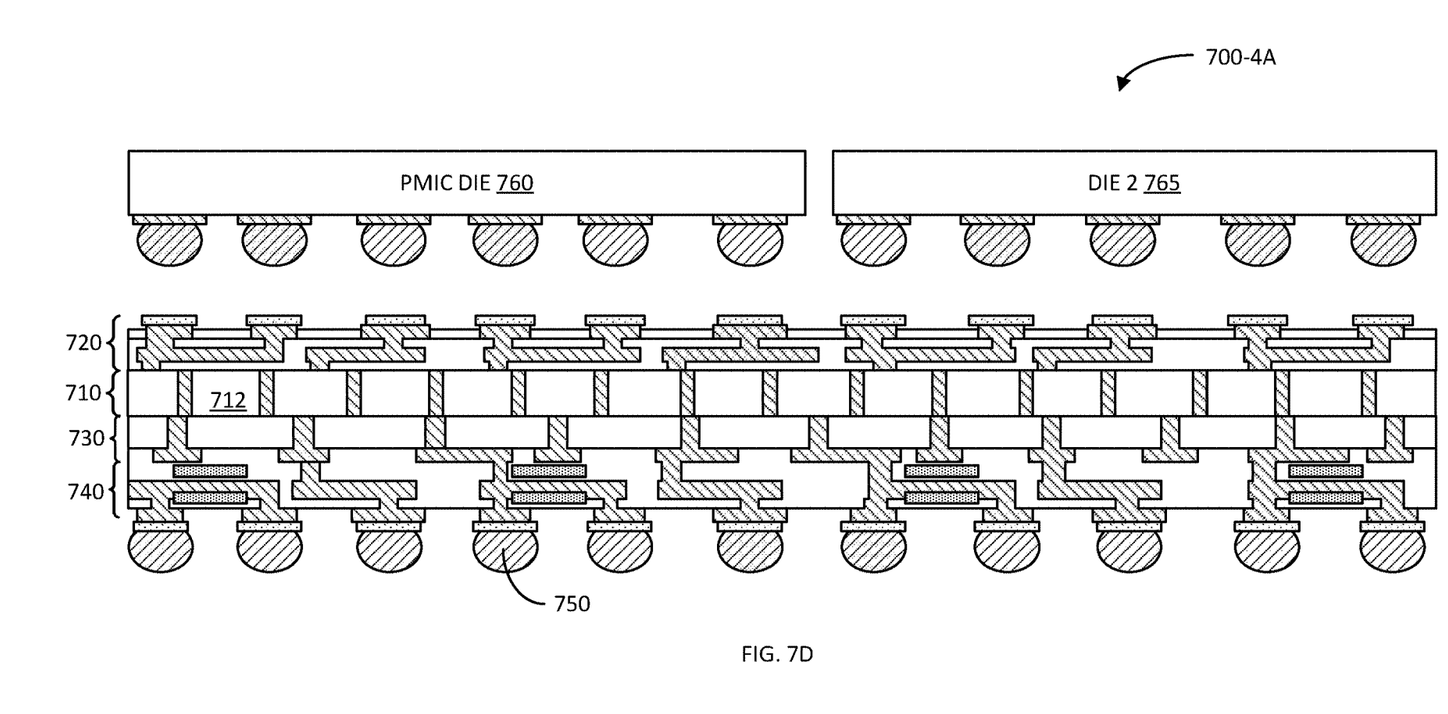
Figure 7E:
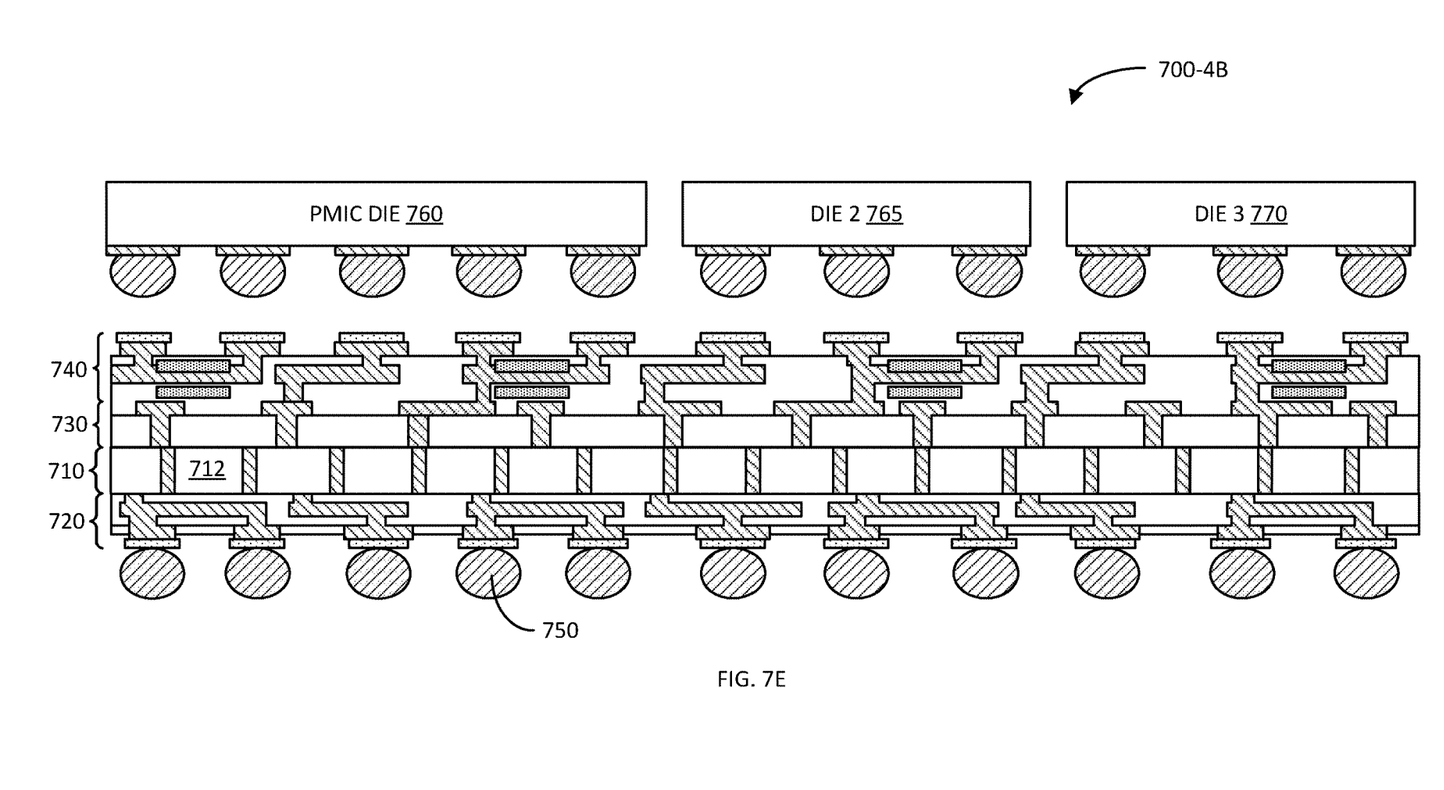

With further reference to FIG. 7D, according to the 2.5D FOWLP method, the IC package 700-4A includes at least one solder bump 750 formed under the TFI 740, and a set of one or more IC dies 760 and 765 surface mounted to the top RDL 720. As an alternative, with reference to FIG. 7E, the IC package 700-4B includes the TFI 740 formed above the TSV 710, and a set of one or more IC dies 760, 765, and 770 surface mounted to the upper side of the TFI 740. The set of one or more IC dies 760, 765, and 770 may be different types of dies (e.g., a PMIC die, a memory die, and other type of die).

The following provides an overview of aspects of the present disclosure:

Aspect 1: A method of forming an integrated circuit (IC) package, comprising: forming a thin-film inductor (TFI) over a first dummy carrier wafer; attaching an integrated circuit (IC) die to and over the TFI; attaching a second dummy carrier wafer to and over the IC die; removing the first dummy carrier wafer from the TFI; attaching at least one solder bump to and under the TFI; and removing the second dummy carrier wafer from the IC die.

Aspect 2: The method of aspect 1, further comprising: forming a first bonding layer over the first dummy carrier wafer; and forming a first electrical insulating layer over the first bonding layer.

Aspect 3: The method of aspect 2, wherein the first electrical insulating layer comprises silicon dioxide ($SiO_2$), silicon nitride ($Si_3N_4$), or a polymer.

Aspect 4: The method of aspect 2 or 3, wherein forming the TFI over the first dummy carrier wafer comprises: forming a first magnetic layer over the first electrical insulating layer; forming a first redistribution layer (RDL) over the first magnetic layer; forming an electrical insulating dome over the first RDL; and forming a second magnetic layer over the electrical insulating dome.

Aspect 5: The method of aspect 4, wherein the first magnetic layer comprises cobalt-zirconium-tantalum (CZT).

Aspect 6: The method of aspect 4, wherein the first magnetic layer comprises cobalt-zirconium-tantalum-boron (CZTB).

Aspect 7: The method of any one of aspects 4-6, wherein the second magnetic layer comprises cobalt-zirconium-tantalum (CZT).

Aspect 8: The method of any one of aspects 4-6, wherein the second magnetic layer comprises cobalt-zirconium-tantalum-boron (CZTB).

Aspect 9: The method of any one of aspects 4-8, wherein the first RDL comprises copper.

Aspect 10: The method of any one of aspects 4-9, wherein the electrical insulating dome comprises a polymer.

Aspect 11: The method of any one of aspects 4-10, further comprising forming a first metallized via hole into the first electrical insulating layer, wherein the first RDL is electrically coupled to the first metallized via hole.

Aspect 12: The method of any one of aspects 4-11, further comprising: forming a first passivation layer over the first RDL; forming a metallized via hole through the first passivation layer; and forming a second RDL over the first passivation layer and the metallized via hole, wherein the second RDL is electrically coupled to the first RDL by way of the metallized via hole.

Aspect 13: The method of aspect 12, further comprising: forming a second passivation layer over the second RDL; forming an under bump metal (UBM) through the second passivation layer and over the second RDL; and forming a solder bump over the UBM, wherein the solder bump is electrically coupled to the first RDL via the UBM, second RDL, and the metallized via hole.

Aspect 14: The method of any one of aspects 1-13, wherein attaching the second dummy carrier wafer to and over the IC die, comprises: forming a bonding layer over the IC die; and placing the second dummy carrier wafer over the bonding layer.

Aspect 15: The method of aspect 14, wherein second dummy carrier wafer comprises a transparent material, and wherein removing the second dummy carrier wafer from the IC die comprises subjecting the bonding layer to a laser via the second dummy carrier wafer to debond the bonding layer from the IC die.

Aspect 16: The method of any one of aspects 1-15, wherein the TFI is attached to the first dummy carrier wafer by way of a bonding layer, wherein the first dummy carrier wafer comprises a transparent material, and wherein removing the first dummy carrier wafer from the TFI comprises subjecting the bonding layer to a laser via the first dummy carrier wafer to debond the bonding layer from the TFI.

Aspect 17: The method of any one of aspects 1-16, wherein the TFI comprises a set of TFIs, wherein the IC die comprises a set of IC dies electrically coupled to the set of TFIs, respectively, and further comprising dicing the IC package to separate distinct pairs of TFI and IC dies.

Aspect 18: The method of any one of aspects 1-17, wherein the IC die comprises a power management integrated circuit (PMIC).

Aspect 19: The method of any one of aspects 1-18, wherein the IC die comprises a set of two or more distinct IC dies.

Aspect 20: The method of any one of aspects 1-19, wherein the TFI comprises a set of TFIs, wherein the IC die comprises sets of distinct IC dies, wherein at least one of the sets of distinct IC dies is electrically coupled to the set of TFIs, respectively, and further comprising dicing the IC package to separate distinct pairs of TFI and set of distinct IC dies.

Aspect 21: A method of forming an integrated circuit (IC) package, comprising forming a first redistribution layer (RDL) over a through-silicon via (TSV); forming a second RDL under the TSV; forming a thin-film inductor (TFI) over the first RDL; and attaching at least one integrated circuit (IC) die to the second RDL or the TFI.

Aspect 22: The method of aspect 21, wherein forming the TFI over the first RDL, comprises: forming an electrical insulating layer over the first RDL; forming a first magnetic layer over the electrical insulating layer; forming a third redistribution layer (RDL) over the first magnetic layer; forming an electrical insulating dome over the third RDL; and forming a second magnetic layer over the electrical insulating dome.

Aspect 23: The method of aspect 22, wherein the first magnetic layer comprises cobalt-zirconium-tantalum (CZT).

Aspect 24: The method of aspect 22, wherein the first magnetic layer comprises cobalt-zirconium-tantalum-boron (CZTB).

Aspect 25: The method of any one of aspects 22-24, wherein the second magnetic layer comprises cobalt-zirconium-tantalum (CZT).

Aspect 26: The method of any one of aspects 22-24, wherein the second magnetic layer comprises cobalt-zirconium-tantalum-boron (CZTB).

Aspect 27: The method of any one of aspects 22-26, wherein the third RDL comprises copper.

Aspect 28: The method of any one of aspects 22-26, wherein the electrical insulating dome comprises a polymer.

Aspect 29: The method of any one of aspects 22-28, further comprising forming a metallized via hole into the electrical insulating layer, wherein the first and third RDLs are electrically coupled to the metallized via hole.

Aspect 30: The method of any one of aspects 22-29, further comprising: forming a first passivation layer over the third RDL; forming a metallized via hole through the first passivation layer; and forming a fourth RDL over the first passivation layer and the metallized via hole, wherein the fourth RDL is electrically coupled to the third RDL by way of the metallized via hole.

Aspect 31: The method of aspect 30, further comprising: forming a second passivation layer over the fourth RDL; forming an under bump metal (UBM) through the second passivation layer and over the fourth RDL; and forming a solder bump over the UBM, wherein the solder bump is electrically coupled to the third RDL via the UBM, fourth RDL, and the metallized via hole.

Aspect 32: The method of aspect 30, wherein attaching the at least one IC die to the TFI comprises attaching the at least one IC die to the fourth RDL.

Aspect 33: The method of any one of aspects 21-32, wherein the at least one IC die comprises a power management integrated circuit (PMIC).

Aspect 34: The method of any one of aspects 21-33, wherein forming the TFI over the first RDL comprises forming a set of TFIs over the first RDL.

Aspect 35: The method of any one of aspects 21-34, wherein attaching at least one IC die comprises attaching a set of IC dies to the second RDL or the set of TFIs, wherein the set of IC dies are electrically coupled to the set of TFIs, respectively.

Aspect 36: The method of aspect 35, wherein the set of IC dies comprise a set of at least two or more different types of IC dies.

Aspect 37: The method of aspect 4, wherein the first magnetic layer and the second magnetic layer slope substantially smooth and parallel at an edge of the TFI.

Aspect 38: The method of aspect 2, further comprising: forming a second electrical insulating layer over the first electrical insulating layer; and forming a metallized via hole through the first and second insulating layer, wherein the first and second electrical insulating layers surround the metallized via hole.

Aspect 39: The method of aspect 1, wherein: the IC die attached to the TFI, and the TFI is attached to a redistribution layer (RDL); or the IC die is attached to the RDL, and the RDL is attached to the TFI.

Aspect 40: An integrated circuit (IC) package, comprising: at least one thin-film inductor (TFI); a set of integrated circuit (IC) dies coupled to the at least one TFI; and a set of solder bumps coupled to the at least one TFI.

Aspect 41: The IC package of aspect 40, wherein at least one of the set of IC dies include an aluminum (AP) layer coupled to a first terminal of the at least one TFI.

Aspect 42: The IC package of aspect 41, wherein at least one of the set of solder bumps is coupled to a second terminal of the at least one TFI.

Aspect 43: The IC package of aspect 42, wherein the at least one TFI comprises: a first magnetic layer; a first redistribution layer (RDL) situated over and electrically isolated from the first magnetic layer, wherein first and second portions of the first RDL on opposite sides of the first magnetic layer serve as the first and second terminals of the at least one TFI, respectively; an electrical insulating dome situated over the first RDL and the first magnetic layer; and a second magnetic layer situated over the electrical insulating dome, wherein the electrical insulating dome electrically isolates the second magnetic layer from the first RDL.

Aspect 44: The IC package of aspect 42 or 43, wherein the AP layer is coupled to the first terminal of the at least one TFI by way of a metallized via hole through an electrical insulating layer.

Aspect 45: The IC package of any one of aspects 42 to 44, wherein the at least one of the set of solder bumps is coupled to the second terminal of the TFI by way of an under bump metal (UBM), a second redistribution layer (RDL), and a metallized via hole through a passivation layer.

Aspect 46: An integrated circuit (IC) package, comprising: a thin-film inductor (TFI); an integrated circuit (IC) die coupled to a first terminal of the TFI; a solder bump coupled to a second terminal of the TFI; and a through-silicon via (TSV) by way of which the IC die or the solder bump is coupled to the first terminal or the second terminal of the TFI, respectively.

Aspect 47: The IC package of aspect 46, wherein the IC die is coupled to the first terminal of the TFI by way of the TSV.

Aspect 48: The IC package of aspect 47, wherein the IC die is coupled to the first terminal of the TFI further by way of a first redistribution layer (RDL).

Aspect 49: The IC package of aspect 48, wherein the solder bump is coupled to the second terminal of the TFI by way of a second redistribution layer (RDL).

Aspect 50: The IC package of aspect 46, wherein the solder bump is coupled to the second terminal of the TFI by way of the TSV.

Aspect 51: The IC package of aspect 50, wherein the solder bump is coupled to the second terminal of the TFI further by way of a first redistribution layer (RDL).

Aspect 52: The IC package of aspect 51, wherein the IC is coupled to the first terminal of the TFI by way of a second redistribution layer (RDL).

Aspect 53: An integrated circuit package, comprising a through-silicon via (TSV) having a first RDL formed on a first side thereof, and a second RDL formed on a second side thereof; a thin-film inductor formed on the first RDL; and an integrated circuit die coupled to the second RDL or the TFI.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. A method of forming an integrated circuit (IC) package, comprising:
   forming a thin-film inductor (TFI) over a first dummy carrier wafer comprising:
     forming a first magnetic layer over a first electrical insulating layer;
     forming a first redistribution layer (RDL) over the first magnetic layer;
     forming an electrical insulating dome over the first RDL; and
     forming a second magnetic layer over the electrical insulating dome;
   attaching an integrated circuit (IC) die to and over the TFI;
   attaching a second dummy carrier wafer to and over the IC die;
   removing the first dummy carrier wafer from the TFI;
   attaching at least one solder bump to and under the TFI; and removing the second dummy carrier wafer from the IC die.

2. The method of claim 1, further comprising:
forming a first bonding layer over the first dummy carrier wafer; and
forming the first electrical insulating layer over the first bonding layer.

3. The method of claim 2, further comprising forming a metallized via hole into the first electrical insulating layer, wherein the first RDL is electrically coupled to the metallized via hole.

4. The method of claim 2, further comprising:
forming a first passivation layer over the first RDL;
forming a metallized via hole through the first passivation layer; and
forming a second RDL over the first passivation layer and the metallized via hole, wherein the second RDL is electrically coupled to the first RDL by way of the metallized via hole.

5. The method of claim 4, further comprising:
forming a second passivation layer over the second RDL;
forming an under bump metal (UBM) through the second passivation layer and over the second RDL; and
forming a solder bump over the UBM, wherein the solder bump is electrically coupled to the first RDL via the UBM, second RDL, and the metallized via hole.

6. The method of claim 1, wherein attaching the second dummy carrier wafer to and over the IC die, comprises:
forming a bonding layer over the IC die; and
placing the second dummy carrier wafer over the bonding layer.

7. The method of claim 6, wherein the second dummy carrier wafer comprises a transparent material, and wherein removing the second dummy carrier wafer from the IC die comprises subjecting the bonding layer to a laser via the second dummy carrier wafer to debond the bonding layer from the IC die.

8. The method of claim 1, wherein the TFI is attached to the first dummy carrier wafer by way of a bonding layer, wherein the first dummy carrier wafer comprises a transparent material, and wherein removing the first dummy carrier wafer from the TFI comprises subjecting the bonding layer to a laser via the first dummy carrier wafer to debond the bonding layer from the TFI.

9. The method of claim 1, wherein the TFI comprises a set of TFIs, wherein the IC die comprises a set of IC dies electrically coupled to the set of TFIs, respectively, and further comprising dicing the IC package to separate distinct pairs of TFI and IC dies.

10. The method of claim 1, wherein the TFI comprises a set of TFIs, wherein the IC die comprises sets of distinct IC dies, wherein at least one of the sets of distinct IC dies is electrically coupled to the set of TFIs, respectively, and further comprising dicing the IC package to separate distinct pairs of TFI and set of distinct IC dies.

11. An integrated circuit (IC) package, comprising:
at least one thin-film inductor (TFI), comprising:
a first magnetic layer;
a first redistribution layer (RDL) situated over and electrically isolated from the first magnetic layer, wherein first and second portions of the first RDL on opposite sides of the first magnetic layer serve as the first and second terminals of the at least one TFI, respectively;
an electrical insulating dome situated over the first RDL and the first magnetic layer; and
a second magnetic layer situated over the electrical insulating dome, wherein the electrical insulating dome electrically isolates the second magnetic layer from the first RDL;
a set of integrated circuit (IC) dies coupled to the at least one TFI; and
a set of solder bump coupled to the at least one TFI.

12. The IC package of claim 11, wherein at least one of the set of IC dies include an aluminum (AP) layer coupled to a first terminal of the at least one TFI.

13. The IC package of claim 11, wherein at least one of the set of solder bump is coupled to a second terminal of the at least one TFI.

14. The IC package of claim 13, wherein the at least one of the set of solder bump is coupled to the second terminal of the TFI by way of an under bump metal (UBM), a second redistribution layer (RDL), and a metallized via hole through a passivation layer.

15. A method of forming an integrated circuit (IC) package, comprising:
forming a first redistribution layer (RDL) over a through-silicon via (TSV);
forming a second RDL under the TSV;
forming a thin-film inductor (TFI) over the first RDL; and
attaching at least one integrated circuit (IC) die to the second RDL or the TFI.

16. The method of claim 15, wherein forming the TFI over the first RDL, comprises:
forming an electrical insulating layer over the first RDL;
forming a first magnetic layer over the electrical insulating layer;
forming a third redistribution layer (RDL) over the first magnetic layer;
forming an electrical insulating dome over the third RDL; and
forming a second magnetic layer over the electrical insulating dome.

17. The method of claim 16, wherein the electrical insulating dome comprises a polymer.

18. The method of claim 16, further comprising forming a metallized via hole into the electrical insulating layer, wherein the first and third RDLs are electrically coupled to the metallized via hole.

19. The method of claim 16, further comprising:
forming a first passivation layer over the third RDL;
forming a metallized via hole through the first passivation layer; and
forming a fourth RDL over the first passivation layer and the metallized via hole, wherein the fourth RDL is electrically coupled to the third RDL by way of the metallized via hole.

20. The method of claim 1, further comprising:
forming a second passivation layer over the fourth RDL;
forming an under bump metal (UBM) through the second passivation layer and over the fourth RDL; and
forming a solder bump over the UBM, wherein the solder bump is electrically coupled to the third RDL via the UBM, fourth RDL, and the metallized via hole.

21. The method of claim 20, wherein attaching the at least one IC die to the TFI comprises attaching the at least one IC die to the fourth RDL.

22. An integrated circuit (IC) package, comprising:
a thin-film inductor (TFI), comprising:
a first magnetic layer;
a first redistribution layer (RDL) situated over and electrically isolated from the first magnetic layer, wherein first and second portions of the first RDL on opposite sides of the first magnetic layer serve as the first and second terminals of the at least one TFI, respectively;

an electrical insulating dome situated over the first RDL and the first magnetic layer; and a second magnetic layer situated over the electrical insulating dome, wherein the electrical insulating dome electrically isolates the second magnetic layer from the first RDL;

an integrated circuit (IC) die coupled to a first terminal of the TFI;

a solder bump coupled to a second terminal of the TFI; and a through-silicon via (TSV) by way of which the IC die or the solder bump is coupled to the first terminal or the second terminal of the TFI, respectively.

23. The IC package of claim 22, wherein the IC die is coupled to the first terminal of the TFI by way of the TSV.

24. The IC package of claim 23, wherein the IC die is coupled to the first terminal of the TFI further by way of the first RDL.

25. The IC package of claim 24, wherein the solder bump is coupled to the second terminal of the TFI by way of the second RDL.

26. The IC package of claim 22, wherein the solder bump is coupled to the second terminal of the TFI by way of the TSV.

27. The IC package of claim 26, wherein the solder bump is coupled to the second terminal of the TFI further by way of the first RDL.

28. The IC package of claim 27, wherein the IC is coupled to the first terminal of the TFI by way of the second RDL.

* * * * *